United States Patent [19]

Picquendar et al.

[11] 4,288,528
[45] Sep. 8, 1981

[54] METHOD OF MAKING AN EMBOSSED PATTERN ON AN INFORMATION BEARING SUBSTRATE

[75] Inventors: Jean E. Picquendar; Michel Marchal; Jean C. Dubois; Eugene Duda, all of Paris, France

[73] Assignee: Thomson-CSF, Paris, France

[21] Appl. No.: 47,219

[22] Filed: Jun. 11, 1979

Related U.S. Application Data

[63] Continuation of Ser. No. 874,840, Feb. 8, 1978, abandoned, which is a continuation of Ser. No. 663,789, Mar. 4, 1976, abandoned, which is a continuation of Ser. No. 433,406, Jan. 14, 1974, abandoned.

[30] Foreign Application Priority Data

Jan. 18, 1973 [FR] France .............................. 73 01746

[51] Int. Cl.³ .............................................. G03C 5/00
[52] U.S. Cl. ................................... 430/297; 156/643; 156/659; 156/664; 346/76 L; 427/43.1; 427/53.1; 427/271; 430/5; 430/296; 430/323; 430/325; 430/326; 430/394; 430/502; 430/945
[58] Field of Search ............. 96/27 R, 27 H, 35, 35.1, 96/36, 38.3, 67, 68, 44; 219/121LM; 156/643, 652, 659, 661, 664; 346/76 L; 427/271, 43.1, 53.1; 430/5, 296, 297, 323, 325, 326, 394, 396, 945, 502

[56] References Cited

U.S. PATENT DOCUMENTS

| | | | |
|---|---|---|---|
| 3,245,793 | 4/1966 | Smith | 96/35.1 |
| 3,314,073 | 4/1967 | Becker | 96/27 H |
| 3,506,779 | 4/1970 | Brown | 96/27 H |
| 3,574,014 | 4/1971 | Hugle | 156/643 |
| 3,650,796 | 3/1972 | Jackson | 96/36.2 |
| 3,668,028 | 6/1972 | Short | 156/3 |
| 3,674,492 | 7/1972 | Goldrick et al. | 96/68 |
| 3,761,264 | 9/1973 | Sterzer | 96/36.2 X |
| 3,773,514 | 11/1973 | Fromson | 96/36 |
| 3,832,948 | 9/1974 | Barker | 101/401.1 |
| 3,894,179 | 7/1975 | Jacobs et al. | 430/945 X |
| 3,924,093 | 12/1975 | Feldman et al. | 96/38.3 |

OTHER PUBLICATIONS

Kodak Autopositive Resist, Type 3; 1969.

Primary Examiner—Edward C. Kimlin
Attorney, Agent, or Firm—Cushman, Darby & Cushman

[57] ABSTRACT

An improved process for forming an embossed pattern through the use of a writing concentrated beam opening holes in a film capable of undergoing residue free evaporation. A layer of photoresist is overlayed with the film and upon being exposed and processed the layer supplies the prospective embossed pattern.

10 Claims, 5 Drawing Figures

METHOD OF MAKING AN EMBOSSED PATTERN ON AN INFORMATION BEARING SUBSTRATE

CROSS REFERENCE TO RELATED APPLICATIONS

This is a continuation of our earlier copending application Ser. No. 874,840 filed Feb. 3, 1978 which, in turn, is a continuation of Ser. No. 663,789 filed Mar. 4, 1976, and which, in turn, is a continuation of Ser. No. 433,406, filed Jan. 14, 1974, all now abandoned.

The present invention relates to a method of making an embossed pattern which can advantageously be utilised to record video frequency signals.

Amongst the known methods of recording video frequency signals, one can point for example to the use of photoresist layers having a free face locally illuminated by a light source, the illuminated parts subsequently being dissolved in an appropriate solvent to leave behind hollow impressions. However, this method is not always satisfactory, in particular where the photoresist film is not absolutely flat, something which is generally the case. The dimensions of the hollow impressions are thus incorrect and this results in a recording of poor quality.

The etching method in accordance with the invention overcomes these drawbacks.

In accordance with an object of the present invention, there is provided a process for producing an embossed pattern on the flat face of a substrate comprising:
(a) depositing upon said flat face a layer of photoresist material having a thickness at least equal to the depth of said embossed pattern,
(b) depositing upon said layer a film of material capable of undergoing residue free evaporation,
(c) irradiating said film along the prospective embossed areas of said pattern with a concentrated writing beam; said irradiation selectively evaporating said film from said areas for opening holes in said film,
(d) exposing said layer of photoresist material through the holes of said film,
(e) processing said layer for removing the portions of said photoresist material facing said holes.

A further object of the invention is a record material for storage of an embossed pattern comprising: a substrate having a flat face, a layer of photoresist material deposited upon said flat face, and a film of material capable of undergoing residue free evaporation deposited upon said layer; the thickness of said layer being at least equal to the depth of said embossed pattern.

For a better understanding of the invention, and to show how the same may be carried into effect reference will be made to the ensuing description and the accompanying drawings among which:

FIG. 1 schematically illustrates means employed to implement the method of the invention.

Figures 1, 2, 3, 4, 5:
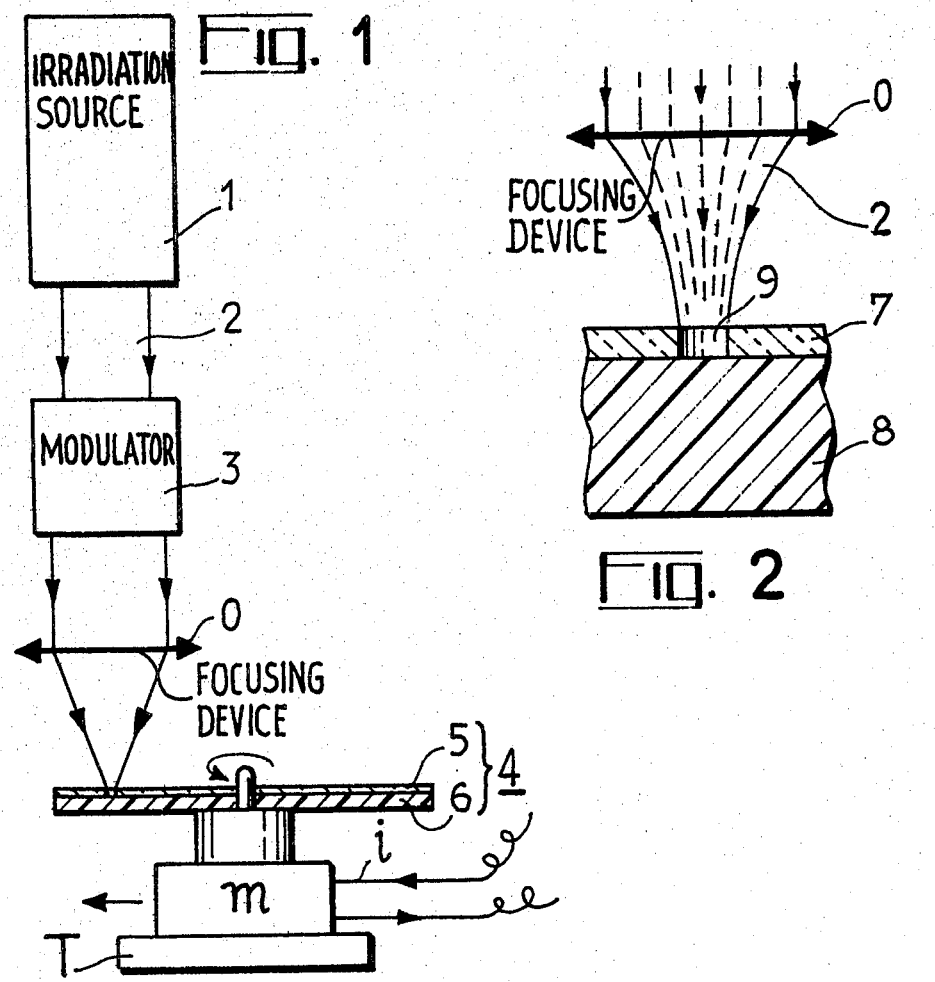
FIG. 2 illustrates a material used to implement the method in accordance with the invention.
FIGS. 3, 4 and 5 illustrate three successive stages of a method of forming embossed patterns on a photoresist layer in accordance with the invention.
FIG. 1 illustrates means for implementing the method of the invention.

A laser 1, for example an argon laser, produces a writing beam 2 of radiant energy which successively passes through a modulator 3, the electrical modulating signal of which controls said writing beam 2, and an objective lens O which focuses the modulated beam on to the surface of a disc 4 made up of a votatilisable material 5 deposited upon a substrate 6. A drive mechanism comprising a motor m, causes the disc 4 to rotate, and a translating system T effects transverse displacement of said disc 4, so that the latter can be appropriately etched or engraved. The concentrated writing beam may be also constituted by a beam of particles such as accelerated electrons.

The volatilisable material which enables the method in accordance with the invention to be carried out, and the substrate upon which it can be arranged, may be of different kinds.

In FIG. 2, an embodiment of a carrier for implementing such a method, has been illustrated.

The voltatilisable material is a layer 7 of poly (methylmethacrylate) (referred to abbreviatedly hereinafter as M.P.M.) to which there has been added a material which absorbs the energy radiated by the coherent light source, the thickness of said layer 7 being substantially equal to 1 $\mu$m for example. The M.P.M. layer 7 has been deposited upon a substrate 8 of polyethyleneterephthalate, whose thickness is around 100 $\mu$m. The concentrated writing beam 2 of radiant energy, issuing from a coherent light source, in focused by means of an objective lens O, for example a microscope lens, onto the layer 7 of M.P.M. where it forms a hole 9 by local residue free evaporation of the material into monomers leading to the depolymerization of the illuminated part of the layer 7. The dimensions of the hole 9 depend upon the energy W of the beam 2 and upon the duration $\Delta t$ of the beam pulse.

By way of non-limitative example, impressions have been obtained in which the holes had a diameter in the order of 1 $\mu$m and a depth likewise in the order of 1 $\mu$m, for a beam power of W=20 mW (within the focal spot) and a pulse duration of $\Delta t = 1$ $\mu$s, the beam having been focused by a microscope lens with a magnification of 40 and an aperture of 0.45.

It is interesting to note that a method of this kind, in accordance with the invention, makes it possible to accept variations in the frontal interval d between the objective lens O and the layer 7 of volatilisable material, thus an error in flatness of the latter, equal to several times the thickness of the layer 7 without any modification to the size of the hole 9 formed in the layer 7. This significant advantage characteristic of the method in accordance with the invention, is encountered in another embodiment of the carrier used to carry out the method of forming the impression.

FIG. 3 illustrates a carrier of this kind, constituted by an aluminium substrate 10 for example with a thickness of about 100 $\mu$m, upon which there has been deposited a layer 11 of photoresist covered by a thin metal film 12 (for example of bismuth). The thickness of the layer 11 of photoresist is substantially equal to the depth of the impression it is desired to produce (1 $\mu$m), whilst the film 12 has a thickness of between 250 and 1000 angstroms units. The concentrated writing beam 2 of radiant energy, focused on the film 12, locally volatilises the bismuth, thus forming a hole 13 whose diameter depends upn the characteristic of the beam 2 (power pulse duration $\Delta t$, convergence).

The formation of the holes 13 which constitute the impression corresponding to the recorded signal, is extremely rapid and the perforation of the bismuth can be effected in real time, something which constitutes another advantage of the method of the invention. The film 12 of bismuth, thus perforated, can then do duty as a mask for the layer 11 of photoresist, which latter is exposed to the radiation from a light source 14 (FIG. 4). The illuminated parts of said layer 11 of photoresist are then dissolved using the conventional method, in an appropriate solvent, in order to leave behind holes an embossed pattern the depth of which is substantially equal to the thickness of the layer 11 of photoresist. The impression thus obtained can be used to form a metal die (of nickel for example) in order to reproduce in large numbers of copies, using conventional techniques, the signal (video frequency signals for example) recording effected by the method of the invention.

By way of non-limitative examples, some results obtained using this method, have been listed.

Utilising:

a miscroscope objective lens with a magnification of 16 (aperture 0.30);

a beam with a power of 5 mW (in the focal spot);

a pulse duration of 1 µs;

a film 12 of bismuth having a thickness of 500 A units, an impression is obtained in which the holes 13 have a diameter substantially equal to 1 µm, the tolerance on the variation $\Delta d$ in the frontal interval d separating the objective lens O from the layer 13 of bismuth, in this case being equal to $\Delta = \pm 20\mu$.

Utilising:

a microscope objective lens of 40 (aperture 0.45), a beam with a power of 2 mW, a pulse duration of 1 µs, a film 12 of bismuth 500 Å units in thickness, the tolerance on the variation in the frontal interval d is then $\Delta d = \pm 5$ µm, the impression being formed by holes having a diameter of substantially 1 µm.

In the example of an impression carrier as described hereinbefore, and utilising bismuth as the volatilisable material, the substrate 10 is in fact constituted by a block of polished aluminum covered, by a wetting operation, with a thin film of resin to ensure good adhesion of the layer 11 of photoresist deposited likewise by a wetting operation, on the aluminium block. The film 12 of bismuth is then deposited by vaporisation under vacuum, upon the layer 11. Other metals, such as cadmium or zinc could be used instead of bismuth. In addition, the polished aluminium block could be replaced by a block of polished glass.

What we claim is:

1. A process for optically recording video frequency signals as an embossed pattern on the flat surface of a disc forming a substrate comprising:
   (a) coating upon said flat surface a layer of photoresist material having a thickness at least equal to the depth of the resulting embossed pattern, the coated photoresist layer adhering to said flat surface;
   (b) depositing upon said layer a film of residue-free, evaporable material having a thickness sufficient for masking said layer against actinic radiation, said film adhering to said layer of photoresist material;
   (c) irradiating said film in situ along the prospective embossed areas of said pattern with a focussed writing beam from a coherent light source, said irradiation selectively evaporating said film from said area thereby opening holes in said film;
   (d) irradiating said layer of photoresist material in situ through the thus opened holes in said film with actinic radiation;
   (e) selectively dissolving said photoresist layer to remove the irradiated portions of said photoresist material facing said holes.

2. A process as claimed in claim 1, wherein the thickness of said film of step (b) is less than the depth of the embossed pattern.

3. A process as claimed in claim 1, wherein the film of step (b) is a metal film.

4. A process as claimed in claim 3, wherein the metal film is selected from the group consisting of bismuth, cadmium and zinc.

5. A process as claimed in claim 3, wherein said film is vacuum evaporated.

6. A process as claimed in claim 3, wherein the film of step (b) is a residue-free, depolymerizable polymer film.

7. A process as claimed in claim 4, wherein said polymer film includes a dye material capable of absorbing the energy of said concentrated writing beam.

8. A process as claimed in claim 1, wherein the thickness of said layer of photoresist material is substantially equal to said depth.

9. A process as claimed in claim 1, wherein said focussed writing beam is intensity modulated with an electrical modulating signal, the embossed pattern being a track followed by said focussed writing beam for successively opening said holes in the film layer deposited in step (b).

10. A process as claimed in claim 1, wherein said focussed writing beam is supplied from a source of radiant energy and focussing means are provided for projecting said focussed writing beam onto said film of evaporable material deposited in step (b).

* * * * *